United States Patent
Fitzgerald et al.

(10) Patent No.: US 9,219,065 B2
(45) Date of Patent: *Dec. 22, 2015

(54) METHOD OF FABRICATING CMOS INVERTER AND INTEGRATED CIRCUITS UTILIZING STRAINED SILICON SURFACE CHANNEL MOSFETS

(75) Inventors: Eugene A. Fitzgerald, Windham, NH (US); Nicole Gerrish, Santa Clara, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 86 days.

This patent is subject to a terminal disclaimer.

(21) Appl. No.: 12/573,589

(22) Filed: Oct. 5, 2009

(65) Prior Publication Data

US 2010/0022073 A1 Jan. 28, 2010

Related U.S. Application Data

(63) Continuation of application No. 10/953,260, filed on Sep. 29, 2004, now abandoned, which is a continuation of application No. 10/611,739, filed on Jul. 1, 2003, now Pat. No. 6,881,632, which is a continuation of application No. 09/884,172, filed on Jun. 19, 2001, now Pat. No. 6,649,480.

(60) Provisional application No. 60/250,985, filed on Dec. 4, 2000.

(51) Int. Cl.
| | |
|---|---|
| *H01L 29/72* | (2006.01) |
| *H01L 27/092* | (2006.01) |
| *H01L 21/8238* | (2006.01) |
| *H01L 29/10* | (2006.01) |

(52) U.S. Cl.
CPC .... *H01L 27/0922* (2013.01); *H01L 21/823807* (2013.01); *H01L 27/092* (2013.01); *H01L 29/1054* (2013.01)

(58) Field of Classification Search
CPC .................................................. H01L 29/1054
USPC ......................................... 438/199, 285, 478
See application file for complete search history.

(56) References Cited

U.S. PATENT DOCUMENTS

| | | | | |
|---|---|---|---|---|
| 5,998,807 | A  * | 12/1999 | Lustig et al. | 257/66 |
| 6,107,653 | A  * | 8/2000 | Fitzgerald | 257/191 |
| 6,316,301 | B1 * | 11/2001 | Kant | 438/197 |
| 6,524,935 | B1 * | 2/2003 | Canaperi et al. | 438/478 |
| 6,649,480 | B2 * | 11/2003 | Fitzgerald et al. | 438/285 |

OTHER PUBLICATIONS

Sugii et al., "Role of SiGe Buffer Layer on Mobility Enhancement in a Strained Si n-Channel Metal-Oxide-Semiconductor Field Effect Transistor", Applied Physics Letters, vol. 75, No. 19, pp. 2948-2950 (Nov. 8, 1999).*

* cited by examiner

*Primary Examiner* — Edward Wojciechowicz
(74) *Attorney, Agent, or Firm* — Slater & Matsil, L.L.P.

(57) ABSTRACT

A method of fabricating a circuit comprising an nMOSFET includes providing a substrate, depositing a strain-inducing material comprising germanium over the substrate, and integrating a pMOSFET on the substrate, the pMOSFET comprising a strained channel having a surface roughness of less than 1 nm. The strain-inducing material is proximate to and in contact with the pMOSFET channel, the strain in the pMOSFET channel is induced by the strain-inducing material, and a source and a drain of the pMOSFET are at least partially formed in the strain-inducing material.

27 Claims, 13 Drawing Sheets

| TYPE OF SURFACE | AVERAGE ROUGHNESS (nm) |
|---|---|
| AS-GROWN GRADED COMPOSITION RELAXED SiGe | 7.9 |
| PLANARIZED SiGe | 0.57 |
| REGROWTH SiGe | -0.6 |

FIG. 3

|  | n ENHANCEMENT | p ENHANCEMENT |
|---|---|---|
| $Si_{0.8}Ge_{0.2}$ | 1.75 | 1 |
| $Si_{0.7}Ge_{0.3}$ | 1.8 | 1.4 |

FIG. 6

|  | BULK SILICON | STRAINED-Si ON 20% SiGe: HIGH SPEED | STRAINED-Si ON 30% SiGe: HIGH SPEED | STRAINED-Si ON 20% SiGe: LOW POWER | STRAINED-Si ON 30% SiGe: LOW POWER |
|---|---|---|---|---|---|
| n ENHANCEMENT | 1 | 1.75 | 1.8 | 1.75 | 1.8 |
| p ENHANCEMENT | 1 | 1 | 1.4 | 1 | 1.4 |
| $W_p$ (μm) | 5.4 | 5.4 | 5.4 | 5.4 | 5.4 |
| $W_n$ (μm) | 1.8 | 1.8 | 1.8 | 1.8 | 1.8 |
| $L_n, L_p$ (μm) | 1.2 | 1.2 | 1.2 | 1.2 | 1.2 |
| $C_L$ (fF) | 32 | 32 | 32 | 32 | 32 |
| $V_{DD}$ (V) | 5 | 4.7 | 4.4 | 4.3 | 3.8 |
| $NM_H$ (V) | 2.053 | 2.218 | 1.949 | 2.037 | 1.682 |
| $NM_L$ (V) | 2.067 | 1.654 | 1.721 | 1.542 | 1.504 |
| $t_{pHL}$ (psec) | 211.3 | 133.7 | 141.6 | 152.2 | 180.1 |
| $t_{pLH}$ (psec) | 195.8 | 220.0 | 173.3 | 254.8 | 226.9 |
| $t_p$ (psec) | 203.5 | 176.9 | 157.4 | 203.5 | 203.5 |
| POWER (mW) | 3.93 | 3.93 | 3.93 | 2.87 | 2.21 |
| % SPEED INCREASE | - | 15.1% | 29.3% | - | - |
| % POWER REDUCTION | - | - | - | 27.0% | 43.7% |

FIG. 7

| | BULK SILICON | STRAINED-Si ON 20% SiGe: CONSTANT $V_{DD}$ | STRAINED-Si ON 30% SiGe: CONSTANT $V_{DD}$ | STRAINED-Si ON 20% SiGe: HIGH SPEED SYMMETRICAL INVERTER | STRAINED-Si ON 30% SiGe: HIGH SPEED SYMMETRICAL INVERTER | STRAINED-Si ON 20% SiGe: LOW POWER SYMMETRICAL INVERTER | STRAINED-Si ON 30% SiGe: LOW POWER SYMMETRICAL INVERTER |
|---|---|---|---|---|---|---|---|
| n ENHANCEMENT | 1 | 1.75 | 1.8 | 1.75 | 1.8 | 1.75 | 1.8 |
| p ENHANCEMENT | 1 | 1 | 1.4 | 1 | 1.4 | 1 | 1.4 |
| $W_p$ (μm) | 5.4 | 5.4 | 5.4 | 9.45 | 6.94 | 9.45 | 6.94 |
| $W_n$ (μm) | 1.8 | 1.8 | 1.8 | 1.8 | 1.8 | 1.8 | 1.8 |
| $L_n, L_p$ (μm) | 1.2 | 1.2 | 1.2 | 1.2 | 1.2 | 1.2 | 1.2 |
| $C_L$ (fF) | 32 | 32 | 32 | 32 | 32 | 32 | 32 |
| $V_{DD}$ (V) | 5 | 5 | 5 | 4.3 | 4.2 | 3.5 | 3.5 |
| $NM_H$ (V) | 2.053 | 2.376 | 2.198 | 1.782 | 1.770 | 1.5018 | 1.4796 |
| $NM_L$ (V) | 2.067 | 1.751 | 1.923 | 1.794 | 1.781 | 1.5101 | 1.4876 |
| $t_{pHL}$ (psec) | 211.3 | 120.7 | 117.4 | 152.0 | 149.5 | 204.4 | 204.1 |
| $t_{pLH}$ (psec) | 195.8 | 195.8 | 139.9 | 145.4 | 143.3 | 202.6 | 202.9 |
| $t_p$ (psec) | 203.5 | 158.3 | 128.6 | 148.7 | 146.4 | 203.5 | 203.5 |
| POWER (mW) | 3.93 | 5.06 | 6.22 | 3.93 | 3.93 | 1.95 | 1.89 |
| % SPEED INCREASE | - | 28.6% | 58.3% | 36.9% | 39.0% | - | - |
| % POWER REDUCTION | - | - | - | - | - | 50.4% | 52.0% |

FIG. 8

| | BULK SILICON | STRAINED-Si ON 20% SiGe: HIGH SPEED | STRAINED-Si ON 30% SiGe: HIGH SPEED | STRAINED-Si ON 20% SiGe: LOW POWER | STRAINED-Si ON 30% SiGe: LOW POWER |
|---|---|---|---|---|---|
| n ENHANCEMENT | 1 | 1.75 | 1.8 | 1.75 | 1.8 |
| p ENHANCEMENT | 1 | 1 | 1.4 | 1 | 1.4 |
| $W_p$ (μm) | 3.11 | 4.12 | 3.53 | 4.12 | 3.53 |
| $W_n$ (μm) | 1.8 | 1.8 | 1.8 | 1.8 | 1.8 |
| $L_n, L_p$ (μm) | 1.2 | 1.2 | 1.2 | 1.2 | 1.2 |
| $C_L$ (fF) | 22.5 | 26.7 | 24.2 | 26.7 | 24.2 |
| $V_{DD}$ (V) | 5 | 4.5 | 4.3 | 4.4 | 3.8 |
| $NM_H$ (V) | 2.370 | 2.275 | 2.123 | 2.220 | 1.872 |
| $NM_L$ (V) | 1.756 | 1.485 | 1.511 | 1.458 | 1.371 |
| $t_{pHL}$ (psec) | 148.4 | 117.3 | 109.3 | 121.5 | 132.4 |
| $t_{pLH}$ (psec) | 238.5 | 254.8 | 204.9 | 265.3 | 254.4 |
| $t_p$ (psec) | 193.4 | 186.0 | 157.1 | 193.4 | 193.4 |
| POWER (mW) | 2.90 | 2.90 | 2.90 | 2.66 | 1.83 |
| % SPEED INCREASE | - | 4.0% | 23.1% | - | - |
| % POWER REDUCTION | - | - | - | 8.4% | 37.1% |

FIG. 9

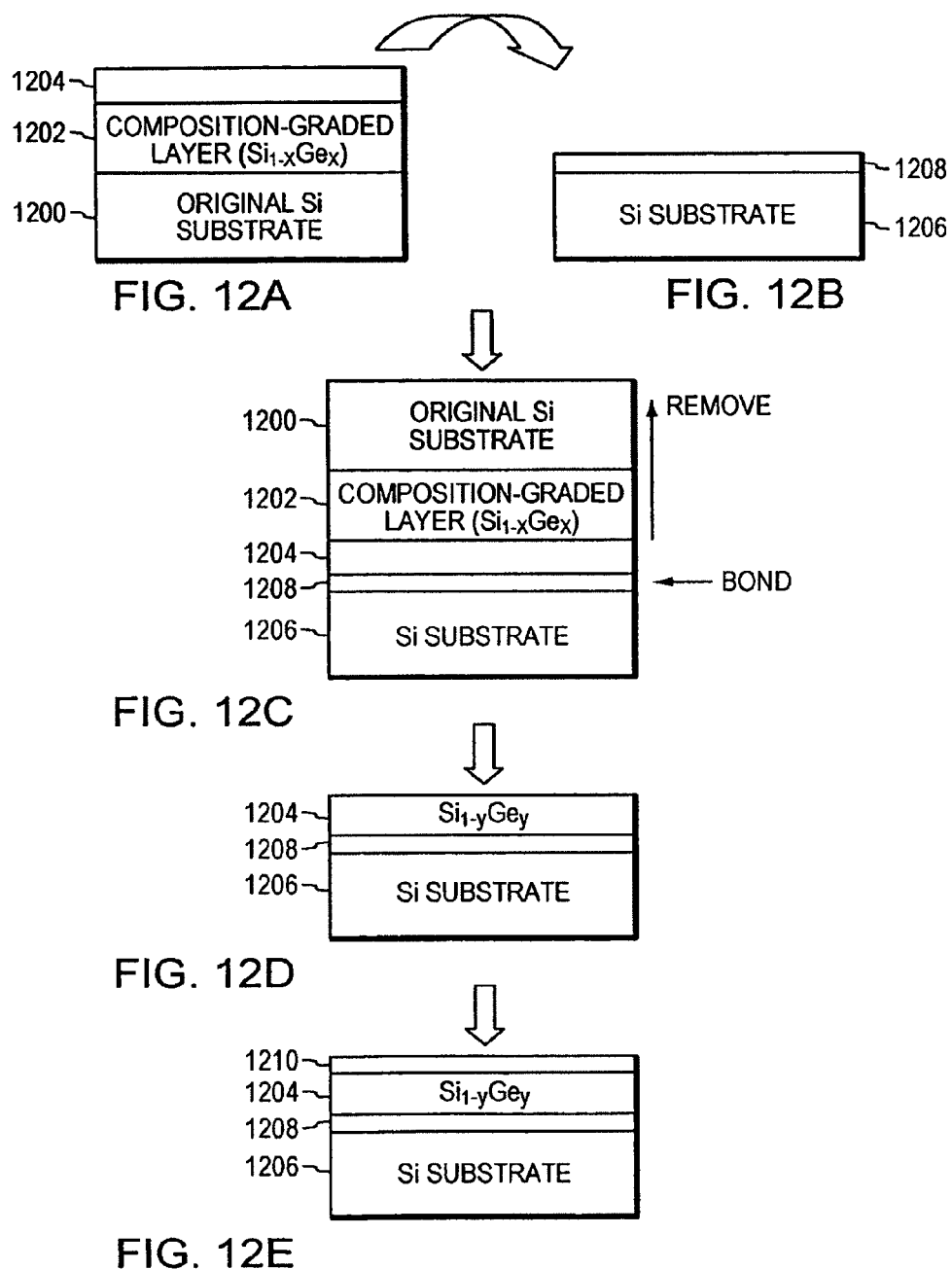

METHOD OF FABRICATING CMOS INVERTER AND INTEGRATED CIRCUITS UTILIZING STRAINED SILICON SURFACE CHANNEL MOSFETS

PRIORITY INFORMATION

This application is a continuation of and claims priority to U.S. patent application Ser. No. 10/953,260, filed Sep. 29, 2004, which is a continuation of U.S. patent application Ser. No. 10/611,739, filed Jul. 1, 2003, now issued as U.S. Pat. No. 6,881,632, which is a continuation of U.S. patent application Ser. No. 09/884,172, filed Jun. 19, 2001, now issued as U.S. Pat. No. 6,649,480, which claims priority from U.S. provisional application Ser. No. 60/250,985 filed Dec. 4, 2000. Each of these applications is hereby incorporated by reference in its entirety.

BACKGROUND OF THE INVENTION

The invention relates to the field of strained silicon surface channel MOSFETs, and in particular to using them in CMOS inverters and other integrated circuits.

The ability to scale CMOS devices to smaller and smaller dimensions has enabled integrated circuit technology to experience continuous performance enhancement. Since the 1970's, gate lengths have decreased by two orders of magnitude, resulting in a 30% improvement in the price/performance per year. Historically, these gains have been dictated by the advancement of optical photolithography tools and photoresist materials. As CMOS device size progresses deeper and deeper into the sub-micron regime, the associated cost of these new tools and materials can be prohibitive. A state of the art CMOS facility can cost more than 1-2 billion dollars, a daunting figure considering that the lithography equipment is generally only useful for two scaling generations.

In addition to economic constraints, scaling is quickly approaching constraints of device materials and design. Fundamental physical limits such as gate oxide leakage and source/drain extension resistance make continued minimization beyond 0.1 µm difficult if not impossible to maintain. New materials such as high k dielectrics and metal gate electrodes must be introduced in order to sustain the current roadmap until 2005. Beyond 2005, the fate of scaling is unclear.

Since the limits of scaling are well within sight, researchers have actively sought other methods of increasing device performance. One alternative is to make heterostructure FETs in GaAs/AlGaAs in order to take advantage of the high electron mobilities in these materials. However, the high electron mobility in GaAs is partially offset by the low hole mobility, causing a problem for complementary FET architectures. In addition, GaAs devices are usually fabricated with Schottky gates. Schottky diodes have leakage currents that are orders of magnitudes higher than MOS structures. The excess leakage causes an increase in the off-state power consumption that is unacceptable for highly functional circuits. Schottky diodes also lack the self-aligned gate technology enjoyed by MOS structures and thus typically have larger gate-to-source and gate-to-drain resistances. Finally, GaAs processing does not enjoy the same economies of scale that have caused silicon technologies to thrive. As a result, wide-scale production of GaAs circuits would be extremely costly to implement.

The most popular method to increase device speed at a constant gate length is to fabricate devices on silicon-on-insulator (SOI) substrates. In an SOI device, a buried oxide layer prevents the channel from fully depleting. Partially depleted devices offer improvements in the junction area capacitance, the device body effect, and the gate-to-body coupling. In the best-case scenario, these device improvements will result in an 18% enhancement in circuit speed. However, this improved performance comes at a cost. The partially depleted floating body causes an uncontrolled lowering of the threshold voltage, known as the floating body effect. This phenomenon increases the off-state leakage of the transistor and thus offsets some of the potential performance advantages. Circuit designers must extract enhancements through design changes at the architectural level. This redesign can be costly and thus is not economically advantageous for all Si CMOS products. Furthermore, the reduced junction capacitance of SOI devices is less important for high functionality circuits where the interconnect capacitance is dominant. As a result, the enhancement offered by SOI devices is limited in its scope.

Researchers have also investigated the mobility enhancement in strained silicon as a method to improve CMOS performance. To date, efforts have focused on circuits that employ a buried channel device for the PMOS, and a surface channel device for the NMOS. This method provides the maximum mobility enhancement; however, at high fields the buried channel device performance is complex due to the activation of two carrier channels. In addition, monolithic buried and surface channel CMOS fabrication is more complex than bulk silicon processing. This complexity adds to processing costs and reduces the device yield.

SUMMARY OF THE INVENTION

In accordance with the invention, the performance of a silicon. CMOS inverter by increasing the electron and hole mobilities is enhanced. This enhancement is achieved through surface channel, strained-silicon epitaxy on an engineered SiGe/Si substrate. Both the n-type and p-type channels (NMOS and PMOS) are surface channel, enhancement mode devices. The technique allows inverter performance to be improved at a constant gate length without adding complexity to circuit fabrication or design.

When silicon is placed under tension, the degeneracy of the conduction band splits forcing two valleys to be occupied instead of six. As a result, the in-plane, room temperature electron mobility is dramatically increased, reaching a value as high as 2900 cm$^2$/V-sec in buried channel devices for electrons densities of $10^{11}$-$10^{12}$ cm$^{-2}$. Mobility enhancement can be incorporated into a MOS device through the structure of the invention. In the structure, a compositionally graded buffer layer is used to accommodate the lattice mismatch between a relaxed SiGe film and a Si substrate. By spreading the lattice mismatch over a distance, the graded buffer minimizes the number of dislocations reaching the surface and thus provides a method for growing high-quality relaxed SiGe films on Si. Subsequently, a silicon film below the critical thickness can be grown on the SiGe film. Since the lattice constant of SiGe is larger than that of Si, the Si film is under biaxial tension and thus the carriers exhibit strain-enhanced mobilities.

There are two primary methods of extracting performance enhancement from the increased carrier mobility. First, the frequency of operation can be increased while keeping the power constant. The propagation delay of an inverter is inversely proportional to the carrier mobility. Thus, if the carrier mobility is increased, the propagation delay decreases, causing the overall device speed to increase. This scenario is useful for applications such as desktop computers where the speed is more crucial than the power consumption. Second, the power consumption can be decreased at a constant frequency of operation. When the carrier mobility increases, the gate voltage can be reduced by an inverse fraction while maintaining the same inverter speed. Since power is proportional to the square of the gate voltage, this reduction results in a significant decrease in the power consumption. This situation is most useful for portable applications that operate off of a limited power supply.

Unlike GaAs high mobility technologies, strained silicon devices can be fabricated with standard silicon CMOS processing methods and tools. This compatibility allows for performance enhancement with no additional capital expenditures. The technology is also scalable and thus can be implemented in both long and short channel devices. The physical mechanism behind short channel mobility enhancement is not completely understood; however it has been witnessed and thus can be used to improve device performance. Furthermore, if desired, strained silicon can be incorporated with SOI technology in order to provide ultra-high speed/low power circuits. In summary, since strained silicon technology is similar to bulk silicon technology, it is not exclusive to other enhancement methods. As a result, strained silicon is an excellent technique for CMOS performance improvement.

BRIEF DESCRIPTION OF THE DRAWINGS

FIG. 3 is a table that displays surface roughness data for various relaxed SiGe buffers on Si substrates;

FIG. 6 is a table showing electron and hole mobility enhancements measured for strained silicon on 20% and 30% SiGe;

FIG. 7 is a table showing inverter characteristics for 1.2 μm CMOS fabricated in both bulk and strained silicon when the interconnect capacitance is dominant;

FIG. 8 is a table showing additional scenarios for strained silicon inverters when the interconnect capacitance is dominant;

FIG. 9 is a table showing inverter characteristics for 1.2 μm CMOS fabricated in both bulk and strained silicon when the device capacitance is dominant;

FIGS. 12A-12E show a fabrication process sequence for strained silicon on SOI substrates.

DETAILED DESCRIPTION OF THE INVENTION

Strained Silicon Enhancement

Figure 1:
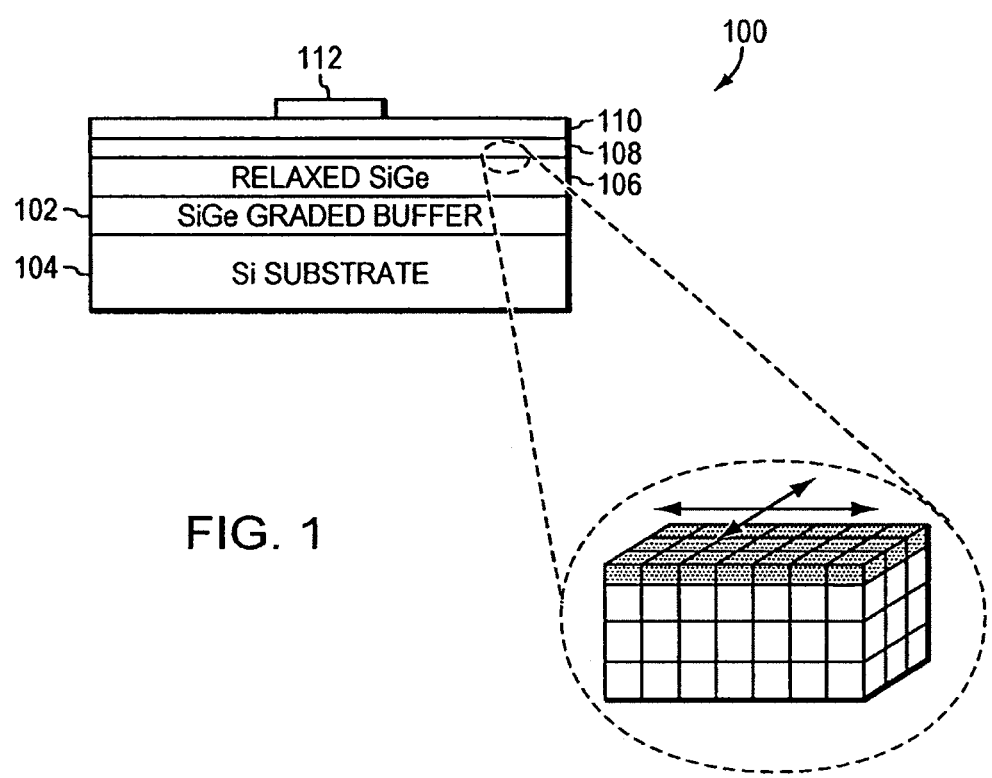
FIG. 1 is a cross-section of the substrate structure required to produce a strained silicon surface channel MOSFET.

FIG. 1 is a cross-section of the substrate structure 100 required to produce a strained silicon surface channel MOSFET. The larger lattice constant, relaxed SiGe layer applies biaxial strain to the silicon surface layer. In this structure, a compositionally graded buffer layer 102 is used to accommodate the lattice mismatch between a relaxed SiGe film 106 and a Si substrate 104. By spreading the lattice mismatch over a distance, the graded buffer minimizes the number of dislocations reaching the surface and thus provides a method for growing high-quality relaxed SiGe films on Si. Subsequently, a silicon film 108 below the critical thickness can be grown on the SiGe film. Since the lattice constant of SiGe is larger than that of Si, the Si film is under biaxial tension and thus the carriers exhibit strain-enhanced mobilities. Thereafter, a layer 110 of $SiO_2$ and a gate 112 are provided thereon.

In the structure shown in FIG. 1, the silicon channel is placed under biaxial tension by the underlying, larger lattice constant SiGe layer. This strain causes the conduction band to split into two-fold and four-fold degenerate bands. The two-fold band is preferentially occupied since it sits at a lower energy. The energy separation between the bands is approximately $$\Delta E_{strain} = 0.67 \cdot x \text{ (eV)} \tag{1}$$

where x is equal to the Ge content in the SiGe layer. The equation shows that the band splitting increases as the Ge content increases. This splitting causes mobility enhancement by two mechanisms. First, the two-fold band has a lower effective mass, and thus higher mobility than the four-fold band. Therefore, as the higher mobility band becomes energetically preferred, the average carrier mobility increases. Second, since the carriers are occupying two orbitals instead of six, inter-valley phonon scattering is reduced, further enhancing the carrier mobility.

Figure 2A:
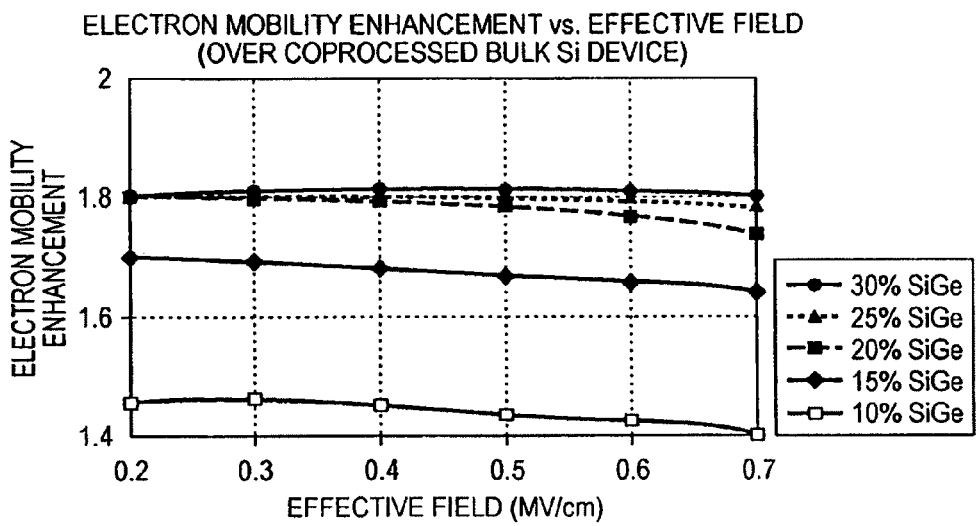
FIGS. 2A and 2B are graphs of mobility enhancements for electrons and holes, respectively, for strained silicon on $Si_{1-x}Ge_x$ for x=10-30%.
Figure 2B:
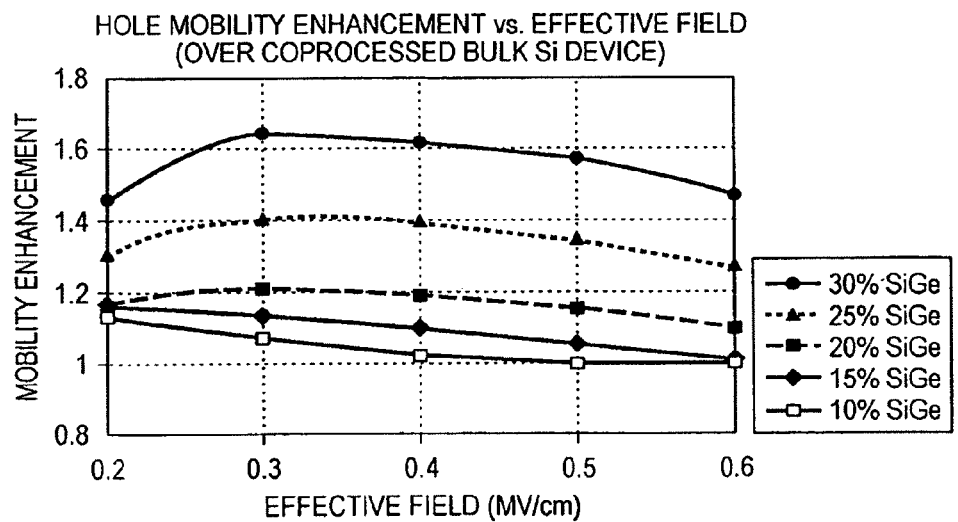

The effects of Ge concentration on electron and hole mobility for a surface channel device can be seen in FIGS. 2A and 2B, respectively. FIGS. 2A and 2B are graphs of mobility enhancements for electrons and holes, respectively, for strained silicon on $Si_{1-x}Ge_x$ for x=10-30%. At 20% Ge, the electron enhancement at high fields is approximately 1.75 while the hole enhancement is essentially negligible. Above approximately 20% Ge, the electron enhancement saturates. This saturation occurs because the conduction band splitting is large enough that almost all of the electrons occupy the high mobility band. Hole enhancement saturation has not yet been observed; therefore, raising the Ge concentration to 30% increases hole mobility by a factor of 1.4. Hole enhancement saturation is predicted to occur at a Ge concentration of about 40%.

The low hole mobility in surface channel devices has caused other researchers to move to higher mobility, buried channel devices for the PMOSFET. Here, it is shown that significant CMOS enhancement can be achieved using surface channel devices for both NMOS and PMOS. This design allows for high performance without the complications of dual channel operation and without adding complexity to circuit fabrication.

Until recently, the material quality of relaxed SiGe on Si was insufficient for utilization in CMOS fabrication. During epitaxial growth, the surface of the SiGe becomes very rough as the material is relaxed via dislocation introduction. Researchers have tried to intrinsically control the surface morphology through the growth; however, since the stress fields from the misfit dislocations affect the growth front, no intrinsic epitaxial solution is possible. U.S. Pat. No. 6,107, 653 issued to Fitzgerald, incorporated herein by reference, describes a method of planarization and regrowth that allows all devices on relaxed SiGe to possess a significantly flatter surface. This reduction in surface roughness is critical in the production of strained Si CMOS devices since it increases the yield for fine-line lithography.

FIG. 3 is a table that displays surface roughness data for various relaxed SiGe buffers on Si substrates. It will be appreciated that the as-grown crosshatch pattern for relaxed $S_{0.8}Ge_{0.2}$ buffers creates a typical roughness of approximately 7.9 nm. This average roughness increases as the Ge content in the relaxed buffer is increased. Thus, for any relaxed SiGe layer that is relaxed through dislocation introduction during growth, the surface roughness is unacceptable for state-of-the-art fabrication facilities. After the relaxed SiGe is planarized, the average roughness is less than 1 nm (typically 0.57 nm), and after a 1.5 µm device layer deposition, the average roughness is 0.77 nm. Therefore, after the complete structure is fabricated, there is over an order of magnitude reduction in the surface roughness. The resulting high quality material is well suited for state of the art CMOS processing.

CMOS Inverter

Figure 4:
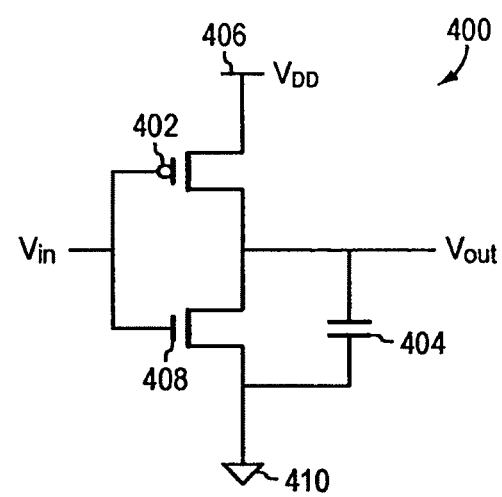
FIG. 4 is a schematic diagram of a CMOS inverter.

FIG. 4 is a schematic diagram of a CMOS inverter 400. When the input voltage, $V_{in}$, to the inverter is low, a PMOS transistor 402 turns on, charges up a load capacitance 404, and the output goes to a gate drive 406, $V_{DD}$. Alternatively, when $V_{in}$ is high, an NMOS transistor 408 turns on, discharges the load capacitance, and the output node goes to ground 410. In this manner, the inverter is able to perform the logic swing necessary for digital processing. The load capacitance, denoted as $C_L$, represents a lumped model of all of the capacitances between $V_{out}$ and ground.

Since the load capacitance must be fully charged or discharged before the logic swing is complete, the magnitude of $C_L$ has a large impact on inverter performance. The performance is usually quantified by two variables: the propagation delay, $t_p$, and the power consumed, P. The propagation delay is defined as how quickly a gate responds to a change in its input and is given by $$t_p = \frac{C_L \cdot V_{DD}}{I_{av}} \quad (2)$$

where $I_{av}$ is the average current during the voltage transition. There is a propagation delay term associated with the NMOS discharging current, $t_{pHL}$, and a term associated with the PMOS charging current, $t_{pLH}$. The average of these two values represents the overall inverter delay:

$$t_p = \frac{t_{pHL} + t_{pLH}}{2} \quad (3)$$

Assuming that static and short-circuit power are negligible, the power consumed can be written as $$P = \frac{C_L \cdot V_{DD}^2}{t_p} \quad (4)$$

From equations 2 and 4, one can see that both the propagation delay and the power consumption have a linear dependence on the load capacitance. In an inverter, $C_L$ consists of two major components: interconnect capacitance and device capacitance. Which component dominates $C_L$ depends on the architecture of the circuit in question.

Strained Silicon, Long Channel CMOS Inverter

Figure 5A:
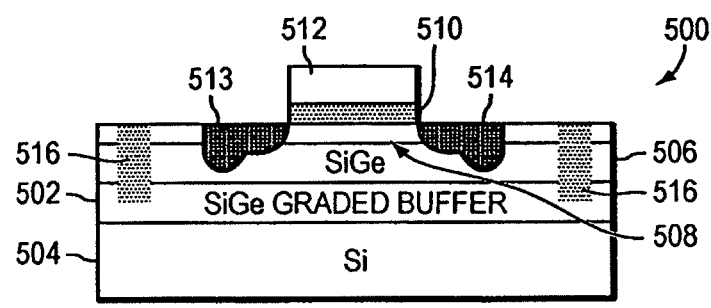
FIGS. 5A and 5B are schematic diagrams of the structures of a strained silicon MOSFET 500 and a strained silicon MOSFET 550 on SOI, respectively.
Figure 5B:
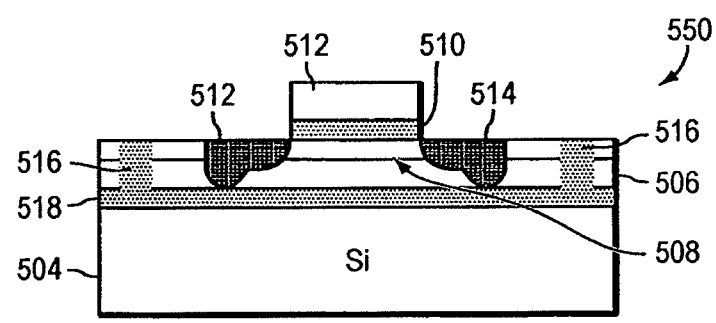

FIGS. 5A and 5B are schematic diagrams of the structures of a strained silicon MOSFET 500 and a strained silicon MOSFET 550 on SOI, respectively. The structure in FIG. 5A contains the elements shown in the substrate structure of FIG. 1 along with basic elements of the MOSFET device structure, i.e. source 513 and drain 514 regions, gate oxide 510 and gate 512 layers, and device isolation regions 516. FIG. 5B shows the same device elements on a SiGe-on-insulator (SGOI) substrate. In the SGOI substrate, a buried oxide layer 518 separates the relaxed SiGe layer 506 from the underlying Si substrate 504. In both MOSFET structures, the strained Si layer 508 serves as the carrier channel, thus enabling improved device performance over their bulk Si counterparts.

When strained silicon is used as the carrier channel, the electron and hole mobilities are multiplied by enhancement factors. FIGS. 2A and 2B demonstrate that this enhancement differs for electrons and holes and also that it varies with the Ge fraction in the underlying SiGe layer.

A summary of the enhancements for $Si_{0.8}Ge_{0.2}$ and $Si_{0.7}Ge_{0.3}$ is shown in FIG. 6. FIG. 6 is a table showing electron and hole mobility enhancements measured for strained silicon on 20% and 30% SiGe. These enhancements are incorporated into 1.2 µm CMOS models in order to quantify the effects on inverter performance. The mobility enhancement can be capitalized upon in two primary ways: 1) increase the inverter speed at a constant power and 2) reduce the inverter power at a constant speed. These two optimization methods are investigated for both a wiring capacitance dominated case and a device capacitance dominated case.

Interconnect Dominated Capacitance

In high performance microprocessors, the interconnect or wiring capacitance is often dominant over the device capacitance. In this scenario, standard silicon PMOS devices are made two to three times wider than their NMOS counterparts. This factor comes from the ratio of the electron and hole mobilities in bulk silicon. If the devices were of equal width, the low hole mobility would cause the PMOS device to have an average current two to three times lower than the NMOS device. Equation 2 shows that this low current would result in a high $t_{pLH}$ and thus cause a large gate delay. Increasing the width of the PMOS device equates the high-to-low and low-to-high propagation delays and thus creates a symmetrical, high-speed inverter.

Key values for a bulk silicon, 1.21 µm symmetrical inverter are shown in FIG. 7. FIG. 7 is a table showing inverter characteristics for 1.2 µm CMOS fabricated in both bulk and strained silicon when the interconnect capacitance is dominant. The strained silicon inverters are optimized to provide high speed at constant power and low power at constant speed. The propagation delay for the bulk silicon inverter is 204 psec and the consumed power is 3.93 mW. In an application where speed is paramount, such as in desktop computing, strained silicon provides a good way to enhance the circuit speed. Assuming no change from the bulk silicon design, a strained silicon inverter on $Si_{0.8}Ge_{0.2}$ results in a 15% speed increase at constant power. When the channel is on $Si_{0.7}Ge_{0.3}$, the speed enhancement improves to 29% (FIG. 7).

The improvement in inverter speed expected with one generation of scaling is approximately 15% (assumes an 11% reduction in feature size). Thus, the speed enhancement provided by a strained silicon inverter on 20% SiGe is equal to one scaling generation, while the speed enhancement provided by 30% SiGe is equivalent to two scaling generations.

Alternatively, reducing the gate drive, $V_{DD}$, can reduce the power at a constant speed. For 20% SiGe, the power consumption is 27% lower than its bulk silicon counterpart. When 30% SiGe is used, the power is reduced by 44% from the bulk silicon value (FIG. 7). This power reduction is important for portable computing applications such as laptops and handhelds.

Equation 4 shows that if $C_L$ is constant and $t_p$ is reduced, $V_{DD}$ must decrease to maintain the same inverter power. If the power consumption is not critical, the inverter frequency can be maximized by employing strained silicon devices at the same $V_{DD}$ as bulk Si devices. As described heretofore above, in a constant power scenario, the inverter speed is increased 15% for Si on $Si_{0.8}Ge_{0.2}$ and 29% for Si on $Si_{0.7}Ge_{0.3}$. When $V_{DD}$ is held constant, this enhancement increases to 29% and 58%, for Si on $Si_{0.8}Ge_{0.2}$ and $Si_{0.7}Ge_{0.3}$, respectively. FIG. 8 is a table showing additional scenarios for strained silicon inverters on 20% and 30% SiGe when the interconnect capacitance is dominant. Parameters are given for 1) strained silicon inverters with the same $V_{DD}$ as comparable bulk silicon inverters 2) symmetrical strained silicon inverters—designed for high speed and 3) symmetrical strained silicon inverters designed for low power.

One drawback of strained silicon, surface channel CMOS is that the electron and hole mobilities are unbalanced further by the uneven electron and hole enhancements. This unbalance in mobility translates to an unbalance in the noise margins of the inverter. The noise margins represent the allowable variability in the high and low inputs to the inverter. In bulk silicon microprocessors, both the low and high noise margins are about 2.06 V. For strained silicon on 20% and 30% SiGe, the low noise margin, $NM_L$, is decreased to 1.65 V and 1.72 V, respectively. While the $NM_L$ is reduced, the associated $NM_H$ is increased. Therefore, if the high input is noisier than the low input, the asymmetric noise margins may be acceptable or even desired.

However, if a symmetrical inverter is required, the PMOS device width must be increased to $\mu_n/\mu_p$ times the NMOS device width. This translates to a 75% increase in PMOS width for $Si_{0.8}Ge_{0.2}$, and a 29% increase for $Si_{0.7}Ge_{0.3}$. If the circuit capacitance is dominated by interconnects, the increased device area will not cause a significant increase in $C_L$. As a result, if the increased area is acceptable for the intended application, inverter performance can be further enhanced. In the constant power scenario, the speed can now be increased by 37% for $Si_{0.8}Ge_{0.2}$, and by 39% for $Si_{0.7}Ge_{0.3}$. When the power is reduced for a constant frequency, a 50% and 52% reduction in consumed power is possible with 20% and 30% SiGe, respectively (FIG. 8). However, in many applications an increase in device area is not tolerable. In these situations if inverter symmetry is required, it is best to use strained silicon on 30% SiGe. Since the electron and hole enhancement is comparable on $Si_{0.7}Ge_{0.3}$, it is easier to trade-off size for symmetry to meet the needs of the application.

Non-Interconnect Dominant Capacitance

The device capacitance is dominant over the wiring capacitance in many analog applications. The device capacitance includes the diffusion and gate capacitance of the inverter itself as well as all inverters connected to the gate output, known as the fan-out. Since the capacitance of a device depends on its area, PMOS upsizing results in an increase in $C_L$. If inverter symmetry is not a prime concern, reducing the PMOS device size can increase the inverter speed. This PMOS downsizing has a negative effect on $t_{pLH}$ but has a positive effect on $t_{pHL}$. The optimum speed is achieved when the ratio between PMOS and NMOS widths is set to $\sqrt{\mu_n/\mu_p}$, where $\mu_n$ and $\mu_p$ represent the electron and hole mobilities, respectively. The optimized design has a propagation delay as much as 5% lower than the symmetrical design. The down side is that making $t_{pLH}$ and $t_{pHL}$ unbalanced reduces the low noise margin by approximately 15%. In most designs, this reduced $NM_L$ is still acceptable.

FIG. 9 is a table showing inverter characteristics for 1.2 μm CMOS fabricated in both bulk and strained silicon when the device capacitance is dominant. The strained silicon inverters are optimized to provide high speed at constant power and low power at constant speed. For strained silicon on $Si_{0.8}Ge_{0.2}$, the electron mobility is a factor of 5.25 higher than the hole mobility. When the PMOS width is re-optimized to accommodate these mobilities, i.e., by using the $\sqrt{\mu_n/\mu_p}$ optimization, the strained silicon PMOS device on $Si_{0.8}Ge_{0.2}$ is over 30% wider than the bulk Si PMOS device.

The resulting increase in capacitance offsets some of the advantages of the enhanced mobility. Therefore, only a 4% speed increase occurs at constant power, and only an 8% decrease in power occurs at constant speed (FIG. 9). Although these improvements are significant, they represent a fraction of the performance improvement seen with a generation of scaling and do not surpass the performance capabilities available with SOI architectures.

In contrast, strained silicon on $Si_{0.7}Ge_{0.3}$ offers a significant performance enhancement at constant gate length for circuits designed to the $\sqrt{\mu_n/\mu_p}$ optimization. Since the electron and hole mobilities are more balanced, the effect on the load capacitance is less substantial. As a result, large performance gains can be achieved. At constant power, the inverter speed can be increased by over 23% and at constant speed, the power can be reduced by over 37% (FIG. 9). The latter enhancement has large implications for portable analog applications such as wireless communications.

As in the microprocessor case (interconnect dominated), the strained silicon devices suffer from small low noise margins. Once again, this effect can be minimized by using 30% SiGe. If larger margins are required, the PMOS device width can be increased to provide the required symmetry. However, this PMOS upsizing increases $C_L$ and thus causes an associated reduction in performance. Inverter design must be tuned to meet the specific needs of the intended application.

Short Channel CMOS Inverter

Figure 10:
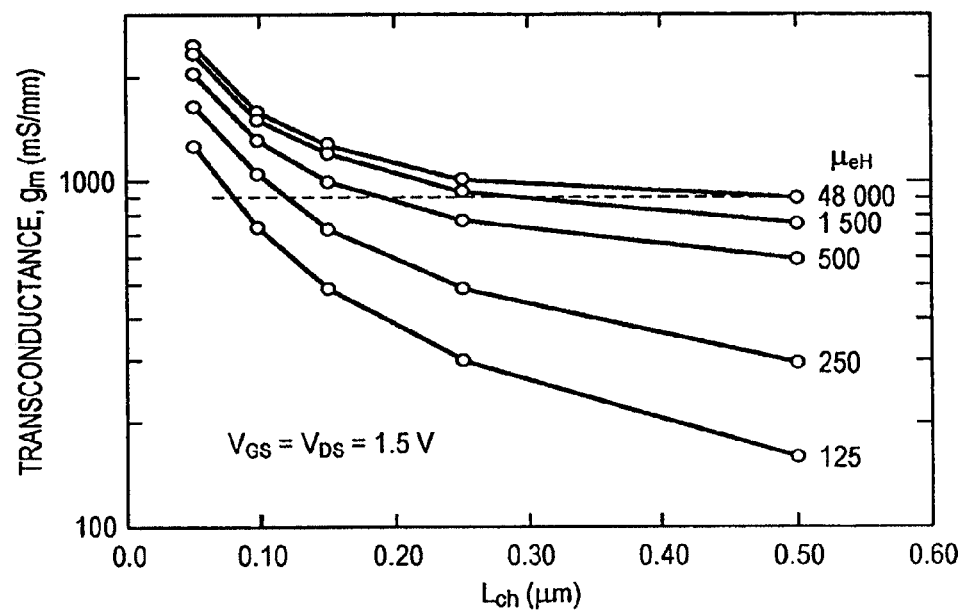
FIG. 10 is a graph showing NMOSFET transconductance versus channel length for various carrier mobilities.

In short channel devices, the lateral electric field driving the current from the source to the drain becomes very high. As a result, the electron velocity approaches a limiting value called the saturation velocity, $v_{sat}$. Since strained silicon provides only a small enhancement in $v_{sat}$ over bulk silicon, researchers believed that strained silicon would not provide a performance enhancement in short channel devices. However, recent data shows that transconductance values in short channel devices exceed the maximum value predicted by velocity saturation theories. FIG. 10 is a graph showing NMOSFET transconductance versus channel length for various carrier mobilities. The dashed line indicates the maximum transconductance predicted by velocity saturation theories. The graph shows that high low-field mobilities translate to high high-field mobilities. The physical mechanism for this phenomenon is still not completely understood; however, it demonstrates that short channel mobility enhancement can occur in strained silicon.

The power consumed in an inverter depends on both $V_{DD}$ and $t_p$ (equation 4). Therefore, as $t_p$ is decreased due to mobility enhancement, $V_{DD}$ must also be decreased in order to maintain the same power consumption. In a long channel device, the average current, $I_{av}$, is proportional to $V_{DD}^2$. Inserting this dependence into equation 2 reveals an inverse dependence of the propagation delay on $V_{DD}$. Thus, as the average current in strained silicon is increased due to mobility enhancement, the effect on the propagation delay is somewhat offset by the reduction in $V_{DD}$.

A comparison of the high-speed scenario in FIG. 7 to the constant $V_{DD}$ scenario in FIG. 8 reveals the effect the reduced $V_{DD}$ has on speed enhancement. In a short channel device, the average current is proportional to $V_{DD}$ not $V_{DD}^2$, causing the propagation delay to have no dependence on $V_{DD}$ (assuming $V_{DD} \gg V_T$). As a result, mobility enhancements in a short channel, strained silicon inverter are directly transferred to a reduction in $t_p$. A 1.2 μm strained silicon inverter on 30% SiGe experiences a 29% increase in device speed for the same power. Assuming the same levels of enhancement, a short channel device experiences a 58% increase in device speed for constant power, double the enhancement seen in the long channel device.

Figure 11:
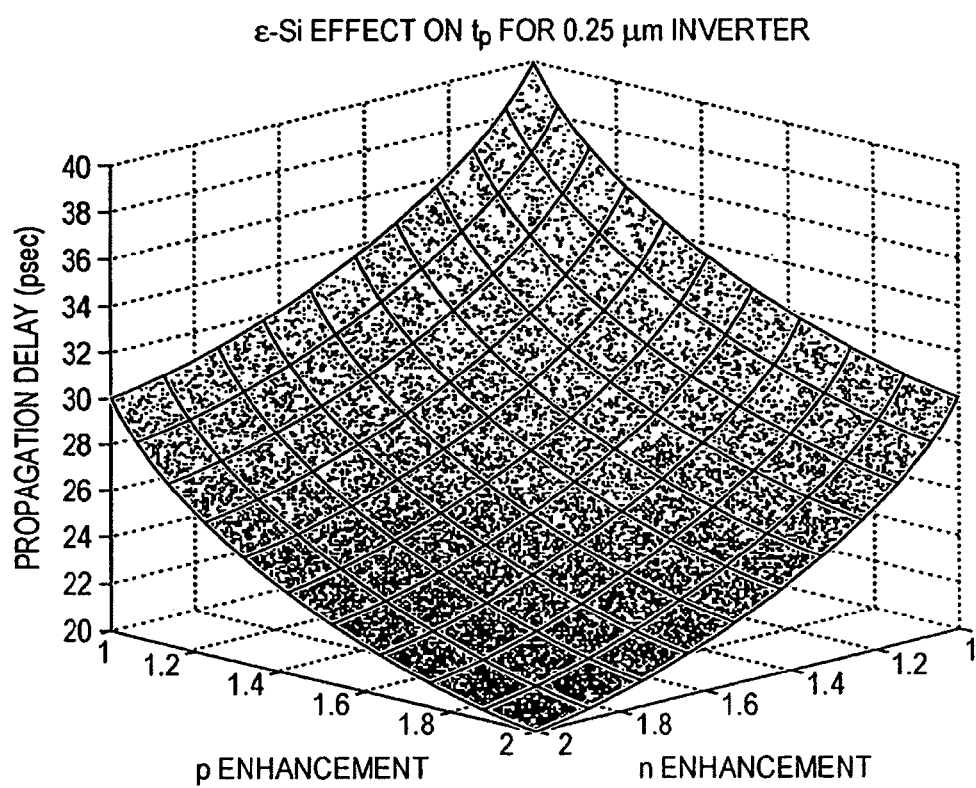
FIG. 11 is a graph showing the propagation delay of a 0.25 μm CMOS inverter for a range of electron and hole mobility enhancements.

FIG. 11 is a graph showing the propagation delay of a 0.25 μm CMOS inverter for a range of electron and hole mobility enhancements. Although the exact enhancements in a short channel device vary with the fabrication processes, FIG. 11 demonstrates that even small enhancements can result in a significant effect on $t_p$.

Strained Silicon on SOI

Strained silicon technology can also be incorporated with SOI technology for added performance benefits. FIGS. 12A-12E show a fabrication process sequence for strained silicon on SOI substrates. First, a SiGe graded buffer layer 1202 is grown on a silicon substrate 1200 with a uniform relaxed SiGe cap layer 1204 of the desired concentration (FIG. 12A). This wafer is then bonded to a silicon wafer 1206 oxidized with a SiO$_2$ layer 1208 (FIGS. 12B-12C). The initial substrate and graded layer are then removed through either wafer thinning or delamination methods. The resulting structure is a fully relaxed SiGe layer on oxide (FIG. 12D). A strained silicon layer 1210 can subsequently be grown on the engineered substrate to provide a platform for strained silicon, SOI devices (FIG. 12E). The resulting circuits would experience the performance enhancement of strained silicon as well as about an 18% performance improvement from the SOI architecture. In short channel devices, this improvement is equivalent to 3-4 scaling generations at a constant gate length.

A similar fabrication method can be used to provide relaxed SiGe layers directly on Si, i.e., without the presence of the graded buffer or an intermediate oxide. This heterostructure is fabricated using the sequence shown in FIGS. 12A-12D without the oxide layer on the Si substrate. The graded composition layer possesses many dislocations and is quite thick relative to other epitaxial layers and to typical step-heights in CMOS. In addition, SiGe does not transfer heat as rapidly as Si. Therefore, a relaxed SiGe layer directly on Si is well suited for high power applications since the heat can be conducted away from the SiGe layer more efficiently.

Other Digital Gates

Figure 13A:
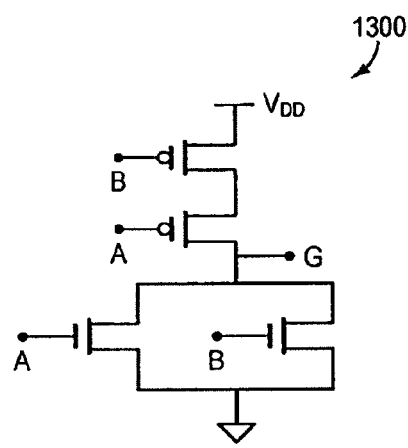
FIGS. 13A-13C are circuit schematics for a NOR gate, a NAND gate and a XOR gate, respectively.
Figure 13B:
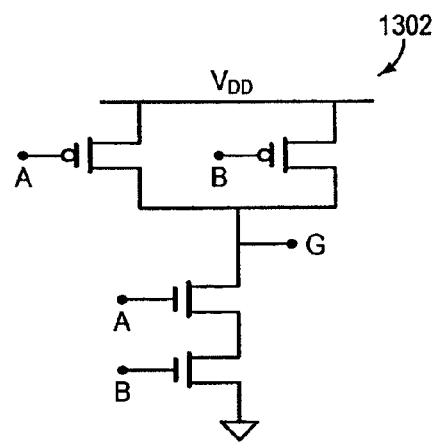
Figure 13C:
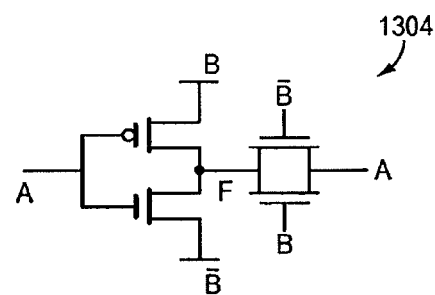

Although the preceding embodiments describe the performance of a CMOS inverter, strained silicon enhancement can be extended to other digital gates such as NOR, NAND, and XOR structures. Circuit schematics for a NOR gate 1300, a NAND gate 1302 and a XOR gate 1304 are shown in FIGS. 13A-C, respectively. The optimization procedures are similar to that used for the inverter in that the power consumption and/or propagation delay must be minimized while satisfying the noise margin and area requirements of the application. When analyzing these more complex circuits, the operation speed is determined by the worst-case delay for all of the possible inputs.

For example, in the pull down network of the NOR gate 1300 shown in FIG. 13A, the worst delay occurs when only one NMOS transistor is activated. Since the resistances are wired in parallel, turning on the second transistor only serves to reduce the delay of the network. Once the worst-case delay is determined for both the high to low and low to high transitions, techniques similar to those applied to the inverter can be used to determine the optimum design.

The enhancement provided by strained silicon is particularly beneficial for NAND-only architectures. As shown in FIG. 13B, in the architecture of the NAND gate 1302, the NMOS devices are wired in series while the PMOS devices are wired in parallel. This configuration results in a high output when either input A or input B is low, and a low output when both input A and input B are high, thus providing a NAND logic function. Since the NMOS devices are in series in the pull down network, the NMOS resistance is equal to two times the device resistance. As a result, the NMOS gate width must be doubled to make the high to low transition equal to the low to high transition.

Since electrons experience a larger enhancement than holes in strained Si, the NMOS gate width up scaling required in NAND-only architectures is less severe. For 1.2 μm strained silicon CMOS on a $Si_{0.8}Ge_{0.2}$ platform, the NMOS gate width must only be increased by 14% to balance the pull down and pull up networks (assuming the enhancements shown in FIG. 6). Correspondingly, for 1.2 μm CMOS on $Si_{0.7}Ge_{0.3}$, the NMOS width must be increased by 55% since the n and p enhancements are more balanced. The high electron mobility becomes even more important when there are more than two inputs to the NAND gate, since additional series-wired NMOS devices are required.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a circuit, the method comprising:
   providing a substrate;
   depositing a strain-inducing material comprising germanium over the substrate;
   depositing a strained material over the strain-inducing material, the strain-inducing material inducing strain in the strained material;
   integrating a pMOSFET on the substrate, the pMOSFET comprising a first strained channel in the strained material and a first source/drain in the strained material; and
   integrating an nMOSFET on the substrate, the nMOSFET comprising a second strained channel in the strained material and a second source/drain in the strained material,
   wherein the first source/drain is electrically coupled to the second source/drain, a first device width of the pMOSFET and a second device width of the nMOSFET being optimized for an operating parameter based on a ratio of the first device width to the second device width being a function of a ratio of an electron mobility of the strained material to a hole mobility of the strained material.

2. The method of claim 1, wherein the strained material is silicon.

3. The method of claim 1, wherein the step of integrating the pMOSFET comprises providing a device isolation region for the pMOSFET.

4. The method of claim 3, wherein the strain-inducing material comprises SiGe and is proximate the device isolation region.

5. The method of claim 1, wherein the strain-inducing material comprises silicon.

6. The method of claim 5, wherein the step of integrating the pMOSFET comprises providing a device isolation region for the pMOSFET.

7. The method of claim 6, wherein the device isolation region is proximate the strain-inducing material.

8. The method of claim 1, wherein the pMOSFET and nMOSFET are interconnected to form an inverter.

9. The method of claim 1, wherein the pMOSFET and nMOSFET are interconnected to form a logic gate.

10. The method of claim 9, wherein the logic gate is a NOR gate.

11. The method of claim 9, wherein the logic gate is an XOR gate.

12. The method of claim 9, wherein the logic gate is a NAND gate.

13. The method of claim 1, wherein the pMOSFET serves as a pull-up transistor in the circuit and the nMOSFET serves as a pull-down transistor in the circuit.

14. The method of claim 1, wherein the substrate consists essentially of Si.

15. The method of claim 14, wherein the first strained channel of the pMOSFET is tensilely strained.

16. The method of claim 14, wherein the first strained channel of the pMOSFET consists essentially of silicon.

17. The method of claim 1, wherein the first strained channel of the pMOSFET is disposed over an insulator layer.

18. A method of fabricating a circuit, the method comprising:
providing a substrate with an insulator layer thereon;
disposing a strain-inducing material over the insulator layer;
depositing a strained material over the strain-inducing material, the strain-inducing material inducing strain in the strained material;
integrating a pMOSFET on the substrate, the pMOSFET comprising a first strained channel in the strained material and a first source/drain in the strained material; and
integrating an nMOSFET on the substrate, the nMOSFET comprising a second strained channel in the strained material and a second source/drain in the strained material,
wherein the first source/drain is electrically coupled to the second source/drain, a first device width of the pMOSFET and a second device width of the nMOSFET being optimized for an operating parameter based on a ratio of the first device width to the second device width being a function of a ratio of an electron mobility of the strained material to a hole mobility of the strained material.

19. The method of claim 18, wherein the strain-inducing material comprises germanium.

20. The method of claim 19, wherein the strain-inducing material comprises SiGe.

21. The method of claim 20, wherein the first strained channel of the pMOSFET is tensilely strained.

22. The method of claim 20, wherein the first strained channel of the pMOSFET consists essentially of silicon.

23. The method of claim 18, wherein the step of integrating the pMOSFET comprises providing a device isolation region for the pMOSFET.

24. The method of claim 1, wherein the ratio of the first device width to the second device width is equal to the ratio of the electron mobility of the strained material to the hole mobility of the strained material.

25. The method of claim 1, wherein the ratio of the first device width to the second device width is equal to a square root of the ratio of the electron mobility of the strained material to the hole mobility of the strained material.

26. The method of claim 18, wherein the ratio of the first device width to the second device width is equal to the ratio of the electron mobility of the strained material to the hole mobility of the strained material.

27. The method of claim 18, wherein the ratio of the first device width to the second device width is equal to a square root of the ratio of the electron mobility of the strained material to the hole mobility of the strained material.

* * * * *